(12) United States Patent
Daubenspeck et al.

(10) Patent No.: US 9,040,390 B2
(45) Date of Patent: May 26, 2015

(54) RELEASABLE BURIED LAYER FOR 3-D FABRICATION AND METHODS OF MANUFACTURING

(75) Inventors: Timothy H. Daubenspeck, Colchester, VT (US); Steven E. Molis, Patterson, NY (US); Gordon C. Osborne, Jr., Essex Junction, VT (US); Wolfgang Sauter, Hinesburg, VT (US); Edmund J. Sprogis, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 386 days.

(21) Appl. No.: 13/483,663

(22) Filed: May 30, 2012

(65) Prior Publication Data

US 2013/0320521 A1 Dec. 5, 2013

(51) Int. Cl.
*H01L 21/46* (2006.01)
*H01L 21/683* (2006.01)
*H01L 23/498* (2006.01)
*H01L 21/48* (2006.01)
*H01L 21/768* (2006.01)
*H01L 25/065* (2006.01)

(52) U.S. Cl.
CPC ...... *H01L 21/6835* (2013.01); *H01L 23/49816* (2013.01); *H01L 23/49827* (2013.01); *H01L 21/486* (2013.01); *H01L 2221/68318* (2013.01); *H01L 2221/68345* (2013.01); *H01L 2221/68381* (2013.01); *H01L 21/76829* (2013.01); *H01L 25/0657* (2013.01); *H01L 2224/131* (2013.01); *H01L 2225/06517* (2013.01); *H01L 2225/06513* (2013.01); *Y10S 438/976* (2013.01)

(58) Field of Classification Search
USPC .......................... 438/464, 976, 108, 106, 612
See application file for complete search history.

(56) References Cited

U.S. PATENT DOCUMENTS

| | | | |
|---|---|---|---|
| 5,281,690 A | 1/1994 | Flaim et al. | |
| 6,183,588 B1 * | 2/2001 | Kelly et al. | ................... 156/247 |
| 6,294,407 B1 | 9/2001 | Jacobs | |
| 6,346,484 B1 | 2/2002 | Cotte et al. | |
| 6,438,281 B1 | 8/2002 | Tsukamoto et al. | |
| 6,730,997 B2 | 5/2004 | Beyne et al. | |
| 7,109,093 B2 | 9/2006 | Fitzsimmons et al. | |
| 7,745,863 B2 | 6/2010 | Adkisson et al. | |
| 7,888,741 B2 | 2/2011 | Edelstein et al. | |
| 7,955,955 B2 | 6/2011 | Lane et al. | |
| 8,053,281 B2 | 11/2011 | Honer et al. | |

(Continued)

OTHER PUBLICATIONS

Kugel et al. "Release Layer for Decal Packages", publication date Jul. 1, 1991, www.ip.com, 3 pages.

(Continued)

*Primary Examiner* — Samuel Gebremariam
(74) *Attorney, Agent, or Firm* — Anthony Canale; Roberts Mlotkowski Safran & Cole, P.C.

(57) ABSTRACT

A releasable buried layer for 3-D fabrication and methods of manufacturing is disclosed. The method includes forming an interposer structure which includes forming a carbon rich dielectric releasable layer over a wafer. The method further includes forming back end of the line (BEOL) layers over the carbon rich dielectric layer, including wiring layers and solder bumps. The method further includes bonding the solder bumps to a substrate using flip chip processes. The flip chip processes comprises reflowing the solder bumps and rapidly cooling down the solder bumps which releases the carbon rich dielectric releasable layer from the wafer.

18 Claims, 5 Drawing Sheets

(56) References Cited

U.S. PATENT DOCUMENTS

2003/0038378 A1    2/2003    Jacobs et al.
2008/0233366 A1    9/2008    Edelstein et al.
2010/0248428 A1    9/2010    Yoshida et al.
2010/0267186 A1    10/2010   Wang et al.
2012/0032311 A1    2/2012    Gates et al.

OTHER PUBLICATIONS

Restaino D. et al. "Optimized interfacial strength for dense and porous SiCOH", Semiconductor Research and Development Center, IBM, Hopewell Junction, NY, Source: Advanced Metallization Conference (AMC), 2008, Advanced Metallization Conference 2007, AMC 2007, 1 Page (abstract).

* cited by examiner

RELEASABLE BURIED LAYER FOR 3-D FABRICATION AND METHODS OF MANUFACTURING

FIELD OF THE INVENTION

The invention relates to semiconductor structures and, more particularly, to a releasable buried layer for 3-D fabrication and methods of manufacturing.

BACKGROUND

Standard interposer fabrication for 3-D stacking makes use of a complex process that includes both front and backside wafer level processing, through-Si vias to connect the front side to the backside, and a "handle-wafer" methodology that protects the front side during the backside wiring fabrication. In known processes, the backside silicon is removed by a physical chemical mechanical planarization process, reducing the full wafer thickness from about 750 um down to 50-100 um before the handle-wafer is applied and the backside wiring is formed while the wafer is still intact. Upon completion of backside wiring and bumping processes, the handle wafer is removed just prior to segmenting of the wafer into individual interposer units by a dicing process.

Accordingly, there exists a need in the art to overcome the deficiencies and limitations described hereinabove.

BRIEF SUMMARY

In an aspect of the invention, a method of forming an interposer structure comprises forming a carbon rich dielectric releasable layer over a wafer. The method further comprises forming back end of the line (BEOL) layers over the carbon rich dielectric layer, including wiring layers and solder bumps. The method further comprises bonding the solder bumps to a substrate using flip chip processes. The flip chip processes comprises reflowing the solder bumps and rapidly cooling down the solder bumps which releases the carbon rich dielectric releasable layer from the wafer.

In an aspect of the invention, a method comprises providing a releasable layer over a Si substrate. The method further comprises forming wiring layers upon the releasable layer. The method further comprises bonding the wiring layers to a substrate using reflow processes. The releasable layer is formed to withstand semiconductor back end of the line processing of greater than 300° C. without detaching from the Si substrate. The releaseable layer is formed to detach from the Si substrate after BEOL processing.

In an aspect of the invention, a structure comprises a carbon rich low-k dielectric releasable layer disposed between an Si substrate and wiring layers. The structure further comprises at least one bond pad connecting wiring in the wiring layers to a solder bump connection.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the releasable buried layer for 3-D fabrication, which comprises the structures of the present invention. In still further embodiments, a method in a computer-aided design system is provided for generating a functional design model of the releasable buried layer for 3-D fabrication. The method comprises generating a functional representation of the structural elements of the releasable buried layer for 3-D fabrication.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a releasable buried layer for 3-D fabrication and methods of manufacturing. In embodiments, the present invention makes use of a thin-film SiCOH low-k dielectric material as a back end of the line (BEOL) releasable layer that is both process and thermally compatible with standard Si BEOL processes, e.g., can withstand temperatures of above 150° C. and even above 300° C. These BEOL processes can be, for example, used to fabricate aluminum and Cu BEOL multilevel wiring structures that are used to build interposers and other structures in 3-D packaging designs. SiCOH dielectrics can be used as high-performance insulating materials in BEOL technologies, which can withstand temperatures exceeding 500° C., for example.

In embodiments, a releasable dielectric layer can be formed during a PECVD process in which carbon-containing film precursors are mixed in real time during the deposition process to intentionally create a carbon-rich layer at the interface of such material, e.g., an oxide or other insulator layer. It has been found that this carbon rich interface performs very poorly in adhesion testing, and accordingly is a suitable releasable layer for a BEOL stack built as part of an interposer or 3-D process design. For example, advantageously, the carbon rich layer enables fabrication of a 3-D interposer multilevel wiring component using standard BEOL processing, without the need for through-Si vias, wafer backside processing or the use of handle wafers. This enables a significant cost and process complexity reduction with respect to existing processes for interposer fabrication.

Figure 1:
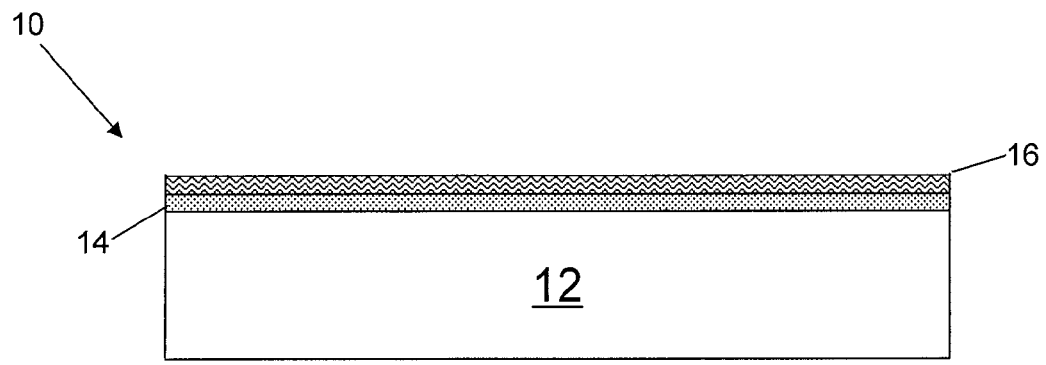
FIG. 1 shows a structure and respective processing steps in accordance with aspects of the present invention.

FIG. 1 shows a structure and respective processing steps in accordance with the present invention. In particular, the structure 10 includes a conventional wafer 12, e.g., silicon, and an optional insulator layer 14. In embodiments, the insulator layer 14 can be, for example, oxide, nitride or other insulating materials. The insulator layer 14 can be deposited using any conventional deposition process, e.g., chemical vapor deposition (CVD). The insulator layer 14 can have a depth of about 0.5 microns, although other dimensions are also contemplated by the present invention.

A releasable layer 16 is formed on the insulator layer 14 (or optionally directly on the wafer 12). In embodiments, the releasable layer 16 is a carbon rich ultra low-k dielectric material. In embodiments, the carbon rich ultra low-k dielectric releasable layer 16 can be deposited to about 10 nm to about 20 nm; although other dimensions are also contemplated by the present invention. In embodiments, the specific film thicknesses and carbon content can be optimized. For example, a carbon content of the releasable layer 16 can be about anywhere from 20% to upwards of 75% relative to other constituent components in the releasable layer, e.g., oxygen, Si and hydrogen components.

In specific processes, the releasable layer 16 can be formed using CVD processes. Specifically, in embodiments, the releasable layer 16 is p-SiCOH film comprised of BCHD (bicycloheptadiene) and DEMS (diethoxymethylsilane). During the deposition process, the chamber is flooded starting at the initial phase of deposition, i.e., time T0, with carbon-containing gas. In embodiments, the flow rate of the carbon can be optimized, depending on the required adhesive properties of the releasable layer 16. These adhesive properties can be dependent on many factors including, but not limited to, BEOL processes (including reflow of the solder bump during packaging), and underlying layers to the releasable layer (i.e., whether the releasable layer is provided on an oxide film, nitride film, directly on the wafer, itself, etc.). For example, the carbon containing precursor can preferably be initially spiked to provide a higher concentration of carbon deposition at the interface.

It should be understood by those of ordinary skill in the art that under normal deposition conditions, the turn-on of BCHD is delayed to allow the formation of a "graded layer" for the purpose of improved adhesion; however, in contrast, in the present invention the BCHD is turned on initially at time T0 to form a carbon rich dielectric releasable layer 16. It has been found that by forming a carbon rich interface with, e.g., the insulator layer 14 or with the wafer 12, the interface is of sufficient strength to hold together through BEOL processing, but will delaminate under an elevated stress condition during solder flow processes.

Alternate embodiments of the releasable layer 16 may include NBlok on both top and bottom of the carbon rich ultra low-k dielectric material 16 film or even a thin layer of conventionally formed p-SiCOH material sandwiched between two carbon rich ultra low-k dielectric material films. Accordingly, the present invention contemplates any structure that makes use of the carbon rich ultra low-k dielectric material 16 as a releasable layer.

Figure 2:
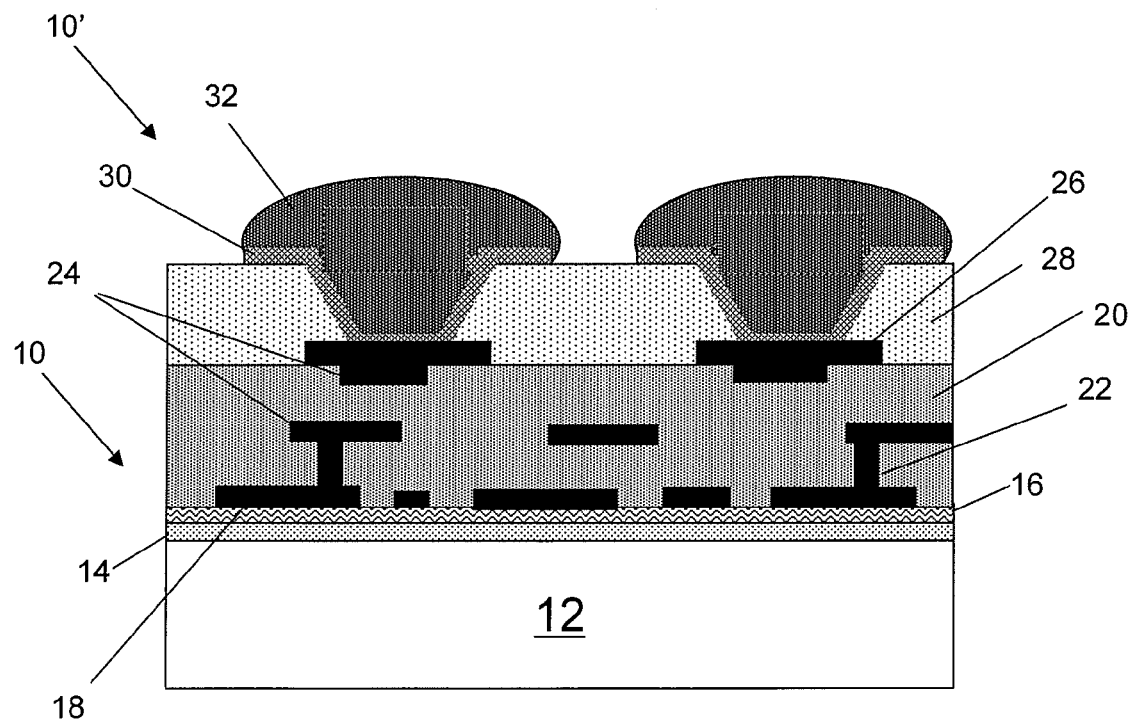
FIG. 2 shows a structure and additional processing steps in accordance with aspects of the present invention.

FIG. 2 shows a structure and BEOL processing steps in accordance with the present invention. More specifically, FIG. 2 shows conventional wiring and solder bump formation processes, (BEOL processes) provided on the releasable layer 16. Specifically, the structure 10' of FIG. 2 includes a first level metallization 18 provided on the releasable layer 16. In embodiments, the first level metallization 18 can be used as contact or bond pads, and can be formed using any conventional additive or subtractive process. For example, in a subtractive process, metal can be deposited on the releasable layer 16 using conventional deposition processes, e.g., CVD. The metal can then be patterned using conventional lithography and etching processes in order to form the first level metallization 18. In embodiments, the first level metallization 18 can be copper or other metal layer, directly in contact with the releasable layer 16.

A dielectric material 20 can then be deposited on the first level metallization 18. The dielectric material 20 can be a low-k dielectric material, formed in a conventional manner. It should be understood by those of skill in the art, that the dielectric material 20 would include a very low or zero concentration of carbon, to ensure quality adhesive properties, particularly during BEOL processes. Thereafter, in subsequent processes, contacts 22 and additional wiring level metallization 24 can be formed using conventional deposition, lithography, etching processes, within subsequent layers of the dielectric material 20. As these subsequent processes are conventional processing steps, no further explanation is required in order for one of skill in the art to understand and practice the present invention. The additional wiring level metallization 24 can be any passive device such as, for example, capacitors, inductors or wiring.

After a top level metallization 26 is formed (either through an additive or subtractive process), a passivation layer 28 can be deposited using conventional deposition processes, e.g., CVD. In embodiments, the top level metallization 26 can be aluminum, in contact with a lower wiring layer. The passivation layer 28 can be, for example, photosensitive polyimide (PSPI).

Still referring to FIG. 2, the passivation layer 28 can be patterned, e.g., using conventional lithography and etching processes, to form a via, which exposes the underlying top level metallization 26. An under-bump metallurgy (UBM) 30, also known as ball-limiting metallurgy (BLM), is formed within the via, contacting the top level metallization 26. The UBM 30 can be formed using conventional deposition (e.g., CVD or plasma vapor deposition (PVD), lithography and etching (e.g., RIE) processes. In embodiments, the UBM 28 can be one or more deposited materials. Specifically, the UBM 30 can be, in non-limiting illustrative examples, a bottom layer of TiW, and a top layer of Cu or CrCu. Other metal layers that can be used for the UBM which include Ta, TaN, Al, Ni, Ni alloys, and Au.

A solder bump 32 can then be formed in contact with the UBM 32. In embodiments, the solder bump 32 can be a lead free solder bump, formed using controlled collapse chip connection (C4) processes. As should be understood by those of ordinary skill in the art, the releasable layer 16 will provide adequate adhesion with the wafer 12 during these BEOL processes.

Figure 3:
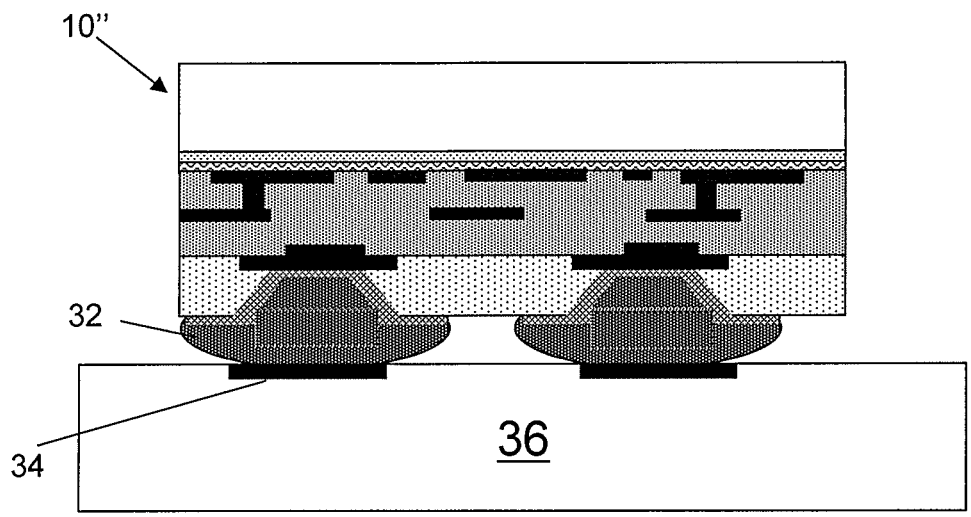
FIGS. 3 and 4 show a bonded assembly and respective processing steps in accordance with aspects of the present invention.
Figure 4:
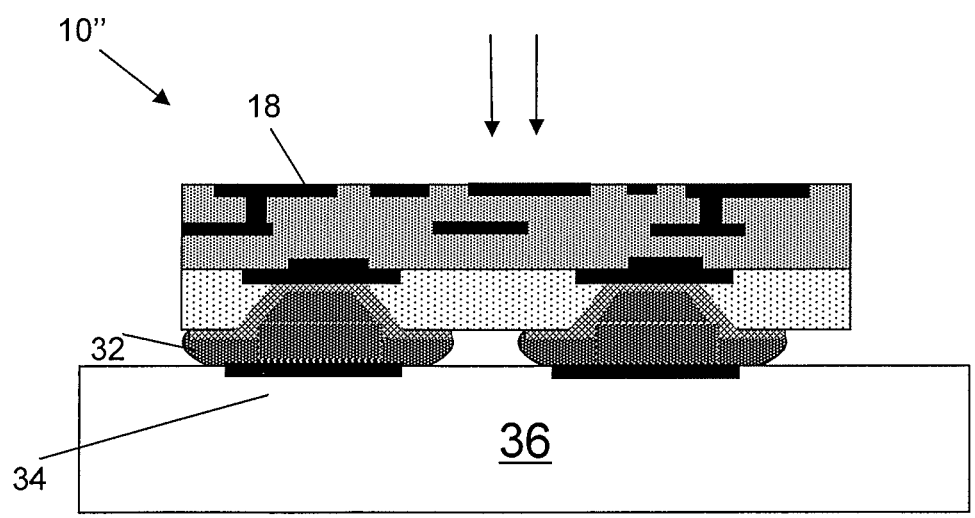

FIGS. 3 and 4 show a bonded assembly and respective processes in accordance with aspects of the present invention. In FIG. 3, prior to the bonding process, the wafer is diced to form a plurality of chips 10". The dicing process is a conventional wafer dicing process such that no further explanation is required herein. After dicing, the chip 10" formed in the processes described above is bonded to a conventional substrate 36, at bonding pads 34. The bonding process begins by flipping the chip 10" over, and aligning the solder bumps 32 with the bonding pads 34 of the substrate 36.

In FIG. 4, the assembly undergoes a reflow process with a fast cool down process as represented by the arrows. The reflow process with a fast cool down process will bond the solder bumps 32 to the bonding pads 34 of the substrate 36, while also automatically releasing the substrate 12. This release is due to the poor adhesion qualities of the releasable layer 16, when thermally stressed by the reflow process together with the fast cool-down process.

In embodiments, the reflow temperature can range from about 375° C. to about 220° C. In specific embodiments, the cool down ramp rate can be, for example, greater than 3° C./sec., with a reflow temperature of 220° C. to 100° C. As another example, cool down ramp rate could be less than 2° C./sec., starting with a temperature of about 100° C. to ambient. As representatively shown in FIG. 4, during the cool down process, the impaired adhesion integrity of the releasable layer 16 will result in the substrate 12 releasing (detaching) from the remaining portions of the package. This release is due to the poor adhesion qualities of the releasable layer 16, resulting from the carbon rich content, when initiated by thermal stress associated with fast cool-down. In embodiments, the fast cool down rate can be followed by a water rinse process to achieve complete separation. It should be understood by those of skill in the art, that the fast cool-down rate is not experienced in normal BEOL thermal processing. As should also be understood by those of skill the art, the high carbon content cannot withstand the stresses and heat imposed during the reflow process with a fast cool down process. Any remaining residue of the releasable layer 16 can be removed by a conventional RIE process, to expose the bond pads 18.

Figure 5:
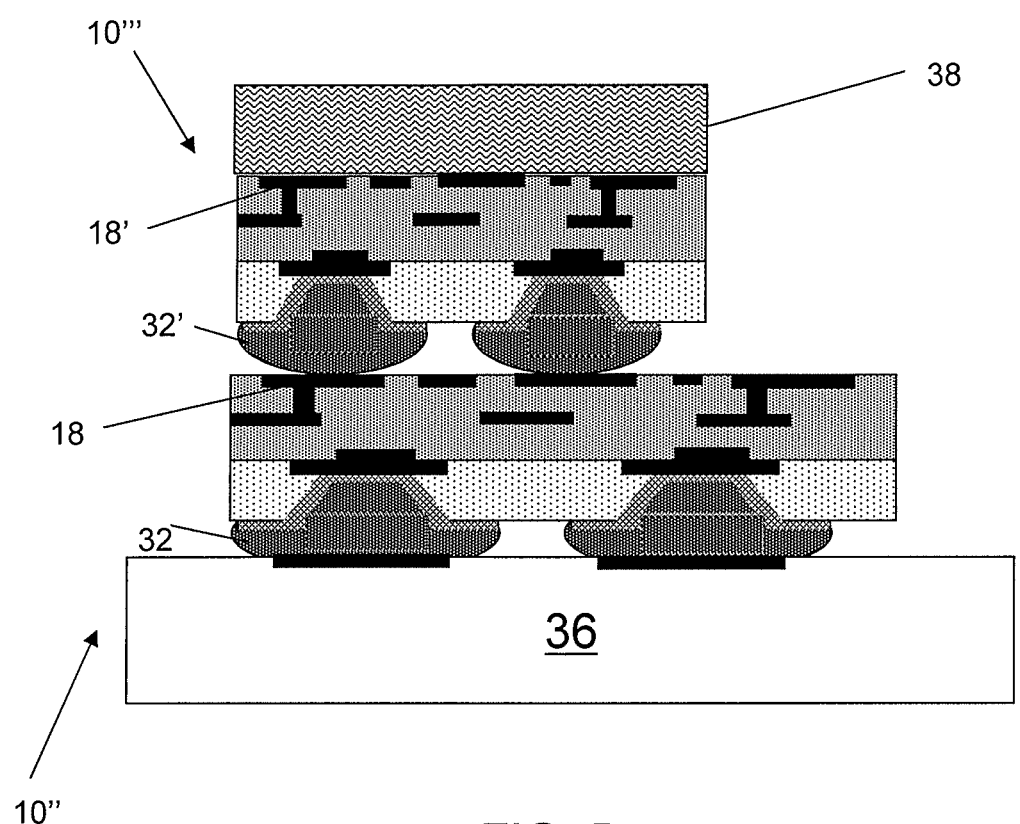
FIG. 5 shows an interposer layer in accordance with aspects of the present invention.

FIG. 5 shows the chip 10" as an interposer layer, in accordance with aspects of the present invention. As shown in FIG. 5, a die assembly 10''' is connected to the interposer 10", in accordance with the present invention. In specific embodiments, the die assembly 10''' includes a solder bump 32' connected to the bond pad 18 of the interposer 10". The bond pad 18' of the die assembly 10''' is electrically connected to a die 38, which can comprise any front end of the line (FEOL) devices, e.g., capacitors, resistors, transistors, etc.

Figure 6:
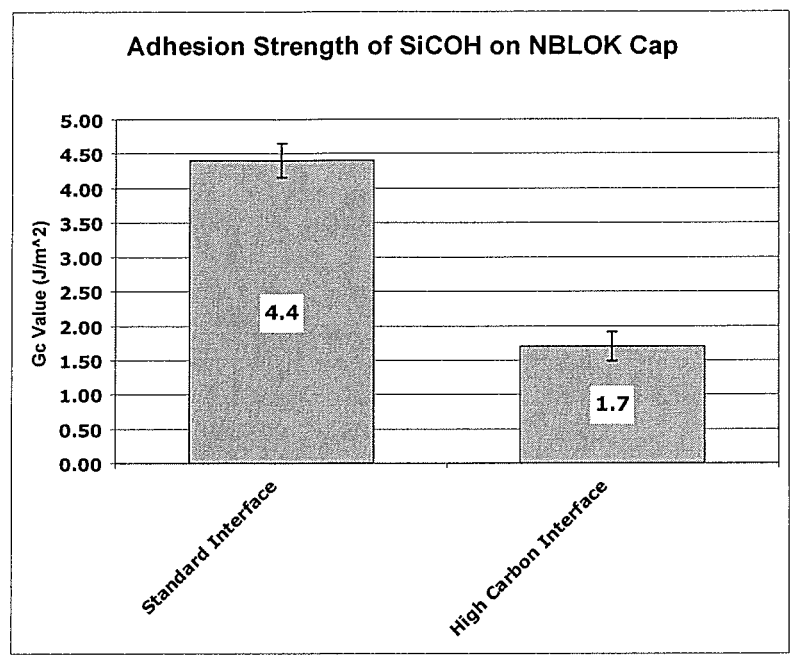
FIG. 6 shows a graph of adhesion properties of the releasable layer of the present invention, compared to conventional dielectric layers.

FIG. 6 shows the adhesion properties of the releasable layer of the present invention, compared to conventional dielectric layers. In the graph of FIG. 6, the Y axis is representative of Joules/$m^2$. As shown from the graph of FIG. 6, the releasable layer of the present invention exhibits considerably less adhesive properties than the conventional dielectric layers. In this way, during the fast cool down process, the impaired adhesion integrity of the releasable layer 16 will result in the substrate releasing (detaching) from the remaining portions of the package.

As should now be understood by those of skill in the art, the releasable layer makes it possible to fabricate a stackable interposer structure using conventional high-temperature BEOL processing, while simplifying standard processing to a significantly more favorable cost point. For example, the releasable layer placed at the bottom of the wiring stack can serve as the I/O level for connection to additional components each with their own solder bumps. In further aspects of the present invention, it is possible to include the releasable layer beneath a polycrystalline Si layer in the case of an SOI-like substrate, which would enable the formation of Si-based devices beneath the BEOL metallization, in the manner of a standard semiconductor chip. Accordingly and advantageously, the present invention that provides a releasable layer composition and thickness to ensure proper adhesive strength during wafer level BEOL and die level chip-join processing. On the other hand, the releasable layer composition is optimized to release from the chip during chip-join and post-clean processing. Thus, it is now possible to use of advanced Si technology BEOL processing for the formation of the interposer layer. This includes advanced ultra-low K dielectric insulating materials and Cu BEOL at very tight pitch, which in turn allows for a high wiring density. And, advantageously, no through silicon via structure or substrate backside processing is needed.

Figure 7:
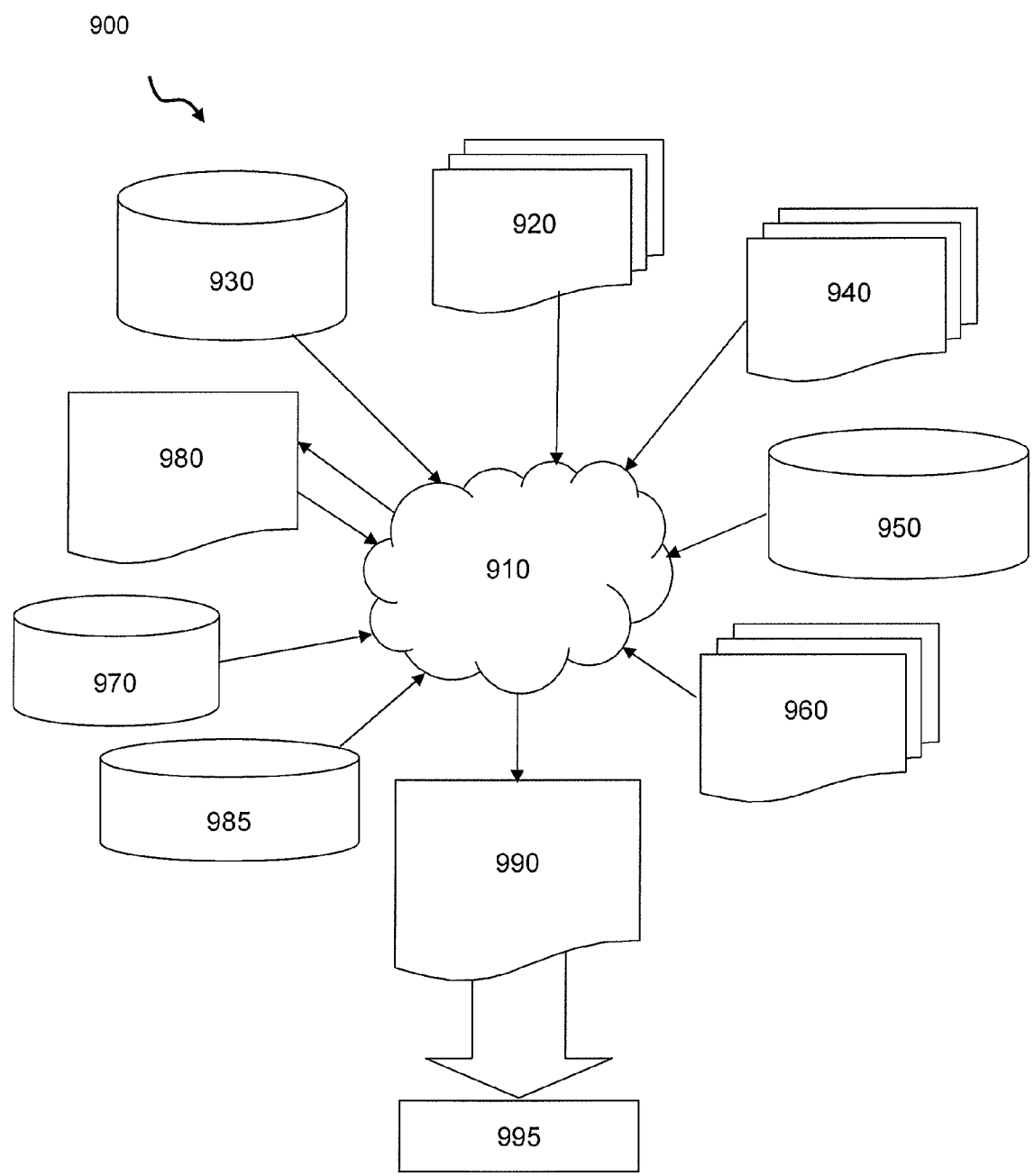
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of forming an interposer structure, comprising:
    forming a carbon rich dielectric releasable layer over a wafer;
    forming back end of the line (BEOL) layers over the carbon rich dielectric layer, including wiring layers and solder bumps; and
    bonding the solder bumps to a substrate using flip chip processes, wherein the flip chip processes comprises reflowing the solder bumps and rapidly cooling down the solder bumps which releases the carbon rich dielectric releasable layer from the wafer.

2. The method of claim 1, wherein the carbon rich dielectric releasable layer is an ultra-low k dielectric layer formed using chemical vapor deposition processes.

3. The method of claim 1, wherein the carbon rich dielectric releasable layer is formed by flooding a processing chamber with carbon at time T0.

4. The method of claim 1, wherein the carbon rich dielectric releasable layer is a p-SiCOH film comprised of BCHD (bicycloheptadiene) and DEMS (diethoxymethylsilane).

5. The method of claim 4, wherein a flow rate of the BCHD is turned on at time T0.

6. The method of claim 1, wherein the carbon rich dielectric releasable layer is formed directly on an oxide film, over the wafer.

7. The method of claim 1, wherein the cooling down comprises a cool down ramp rate of greater than 3° C./sec., with a temperature of 220° C. to 100° C.

8. The method of claim 1, wherein the cooling down comprises a cool down ramp 2° C/sec. with a temperature of about 100° C. to ambient.

9. The method of claim 1, wherein a carbon content of the carbon rich dielectric releasable layer is about 20% to 75% relative to other constituent components in the releasable layer.

10. The method of claim 1, further comprising removing residue of the carbon rich dielectric releasable layer after the cooling down.

11. The method of claim 10, further comprising bonding a package to a bond pad of the interposer, after the cooling down and removal of the residue.

12. A method, comprising:
providing a releasable layer over a Si substrate;
forming wiring layers upon the releasable layer; and
bonding the wiring layers to a substrate using reflow processes, wherein:
the releaseable layer is formed to withstand semiconductor back end of the line processing of greater than 300° C. without detaching from the Si substrate, and
the releaseable layer is formed to detach from the Si substrate after BEOL processing,
wherein the releaseable layer comprises a p-SiCOH layer comprising BCHD (bicycloheptadiene) and DEMS (diethoxymethylsilane).

13. The method of claim 12, further comprising flooding an initial phase of deposition of the releasable layer with a carbon-containing gas.

14. A method, comprising:
providing a releasable layer over a Si substrate;
forming wiring layers upon the releasable layer; and
bonding the wiring layers to a substrate using reflow processes, wherein:
the releaseable layer is formed to withstand semiconductor back end of the line processing of greater than 30020 C. without detaching from the Si substrate, and
the releaseable layer is formed to detach from the Si substrate after BEOL processing,
wherein the releaseable layer is a carbon rich dielectric releasable layer.

15. The method of claim 14, wherein the releasable layer is an ultra-low k dielectric layer formed using chemical vapor deposition processes.

16. The method of claim 14, wherein the carbon rich dielectric releasable layer is formed by flooding a chamber with carbon at time T0.

17. A method, comprising:
providing a releasable layer over a Si substrate;
forming wiring layers upon the releasable layer; and
bonding the wiring layers to a substrate using reflow processes, wherein:
the releaseable layer is formed to withstand semiconductor back end of the line processing of greater than 300° C. without detaching from the Si substrate, and
the releaseable layer is formed to detach from the Si substrate after BEOL processing,
wherein the releaseable layer detaches from the Si substrate during a cooling down process of a solder bonding processes.

18. The method of claim 17, wherein the cooling down comprises a cool down ramp rate of greater than 3°C./sec., with a temperature of 220° C. to 100° C. a cool down ramp 2° C/sec. with a temperature of about 100° C. to ambient.

* * * * *